United States Patent

[11] 3,590,327

[72] Inventor Mauricio A. Thomae
Rochester, N.Y.

[21] Appl. No. 818,869
[22] Filed Apr. 24, 1969
[45] Patented June 29, 1971
[73] Assignee Transmation, Inc.
Rochester, N.Y.

[54] SYSTEM FOR MAINTAINING UNIFORM TEMPERATURE CONDITIONS THROUGHOUT A BODY
12 Claims, 5 Drawing Figs.

[52] U.S. Cl. .......... 317/100, 317/234 A
[51] Int. Cl. .......... H01l 1/10, H01l 1/12
[50] Field of Search .......... 317/99, 100, 234/1,3,4.1; 174/52.6; 264/104, 272; 313/25—27, 47

[56] References Cited
UNITED STATES PATENTS

| | | | |
|---|---|---|---|
| 3,028,473 | 4/1962 | Dyer | 317/234 (1) |
| 3,210,618 | 10/1965 | Rosenberg | 317/234 (3) |
| 3,299,331 | 1/1967 | Lacy | 317/234 (1) |
| 3,317,796 | 5/1967 | Thompson | 174/52.6 |
| 3,411,049 | 11/1968 | Trincossi | 317/100 X |

*Primary Examiner*—Lewis H. Myers
*Assistant Examiner*—Gerald P. Tolin
*Attorney*—Jay M. Cantor

ABSTRACT: The disclosure relates to a temperature regulating system for maintaining temperatures relatively constant throughout a capsule containing electronic components and for causing gradual change, if any, of temperature caused by changes in the outer environment. This is provided by placing the components in a high thermal conductivity material which is enclosed by a low thermal conductivity material. Electronic components and electrical components are glued and potted in apertures within the interior high thermal conductivity member by means of a substantially electrically nonconducting and thermally highly conductive material such as an epoxy filled with beryllium oxide. According to a second embodiment the inner capsule is molded from a high thermal conductivity ceramic such as aluminum oxide or beryllium oxide. It is also possible to encapsulate the components prior to baking of the ceramic material. According to a third embodiment, the electrical and electronic components are potted directly in a beryllium oxide epoxy which will keep the components mechanically rigid within the potting material. Such a material would have substantially no electrical conductivity and very high thermal conductivity.

INVENTOR
MAURICIO A. THOMAE
BY Jay M Cantor

SYSTEM FOR MAINTAINING UNIFORM TEMPERATURE CONDITIONS THROUGHOUT A BODY

This invention relates to a temperature regulating system for maintaining constant temperature throughout a given volume and, more specifically, to a temperature regulating system wherein heat is substantially uniformly distributed throughout an enclosed environment, the enclosed environment also having the property, if necessary, of having substantially no electrical conductivity, high internal thermal conductivity and low thermal conductivity to the outer surroundings.

with the increased automation of industrial processes, the necessity of obtaining precise measurements automatically and transmitting them to a central monitor location or the like for evaluation becomes increasingly important. This problem becomes even more complicated where the components of the measuring circuits are electrical and therefore transmit current. In such systems, it is necessary to have both electrical isolation of the components as well as high thermal conduction between the components.

It is an object of this invention to provide a temperature regulating system for an electrical system which is capable of providing substantially a thermal short circuit and, at the same time, provide electrical isolation.

It is a further object of this invention to provide a temperature regulating capable of maintaining electrical components of a circuit at substantially the same temperature and at relatively low cost.

It is a yet further object of this invention to provide a temperature regulating system for an electrical circuit capable of providing uniform temperatures throughout the circuit and guarding against sudden changes in temperature from the circuit components due to transients external to the system.

The above objects and still further objects of the invention will become apparent to those skilled in the art after consideration of the following drawing and specification which are provided by way of example and not by way of limitation wherein.

Figure 1:
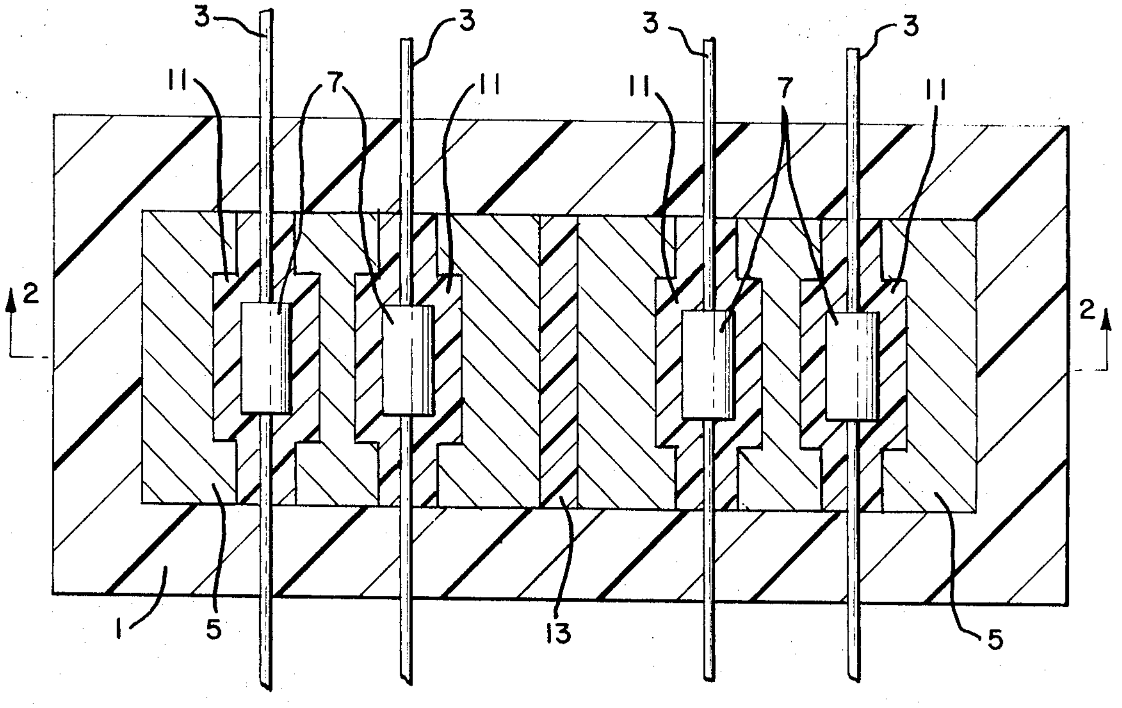
FIG. 1 is a cross-sectional view of a preferred embodiment of the invention.

Briefly, in accordance with a first embodiment of the invention, the electrical components are positioned in apertures of a capsule having high thermal conductivity, the electrical components being potted and glued within the apertures by means of a beryllium oxide epoxy or an aluminum oxide epoxy. The capsule is surrounded by a low thermal conductivity shell through which the leads of the electrical components pass to the external environment.

According to a second embodiment of the invention, the capsule is formed from a high thermal conductivity ceramic such as aluminum oxide or beryllium oxide. Again, the components are placed in apertures formed in the ceramic material and potted and secured therein by means of a beryllium oxide epoxy or an aluminum oxide epoxy.

In accordance with a third embodiment of the invention, the electrical components are positioned in a mold and then potted with a beryllium oxide epoxy to form the entire capsule within the mold. The components are embedded within the beryllium oxide epoxy. In each of the second and third embodiments, the outer low thermal conductivity shell will also be used.

Referring now to the figures, there is shown a temperature regulating system in accordance with a first embodiment of the present invention. This system includes an outer shell 1 of low thermal conductivity material which is preferably rigid and securable to an inner shell. This outer shell has apertures through which leads 3 of the electrical components of the system pass. The space between the leads 3 and the outer shell 1 is small and, in fact, the shell may abut against the leads 3 to prevent thermal conduction to the interior other than through the shell 1 and the leads 3.

Within the shell 1 is formed a capsule 5 of high thermal conductivity material. The shell 5 includes apertures into which the electrical components 7 are placed. The apertures are better shown in FIG. 2 as members 9 which are shown to be circular or square. The potting compound 11 which encapsulates the components as shown in dotted lines in FIG. 1 and is better shown in FIG. 2 as the material between the inside walls of the apertures and the components themselves. A member 13 is shown separating the left and right-hand portions of the capsule 5, the member 13 merely having low electrical conductivity and high thermal conductivity. A mica member of this type would be appropriate. A member 13 is utilized only in the event that electrical separation between different parts of the electrical circuit is necessary. Otherwise, the member 13 can be eliminated. The capsule 5 is formed from materials taken from the class of high thermal conductivity materials. The potting compound would be an oxide of beryllium and the capsule 5 could be formed from a metal having a high thermal conductivity, as an example. In this event, the fact that the components 7 are potted in the beryllium oxide epoxy would provide electrical isolation of the circuit members but not thermal isolation since the beryllium oxide epoxy exhibits substantially low electrical conductivity and very high thermal conductivity. It should at this point be noted that any potting compound having low or substantially no electrical conductivity and very high thermal conductivity as well as the remaining epoxy properties such as good securing properties can be used. To date, only the beryllium oxide epoxy has been found to work satisfactorily. It should be noted that if the potting compound completely encapsulates the electrical components, the capsule 5 can have good electrical conducting properties since the potting compound in itself will provide the electrical isolation.

Figure 2:
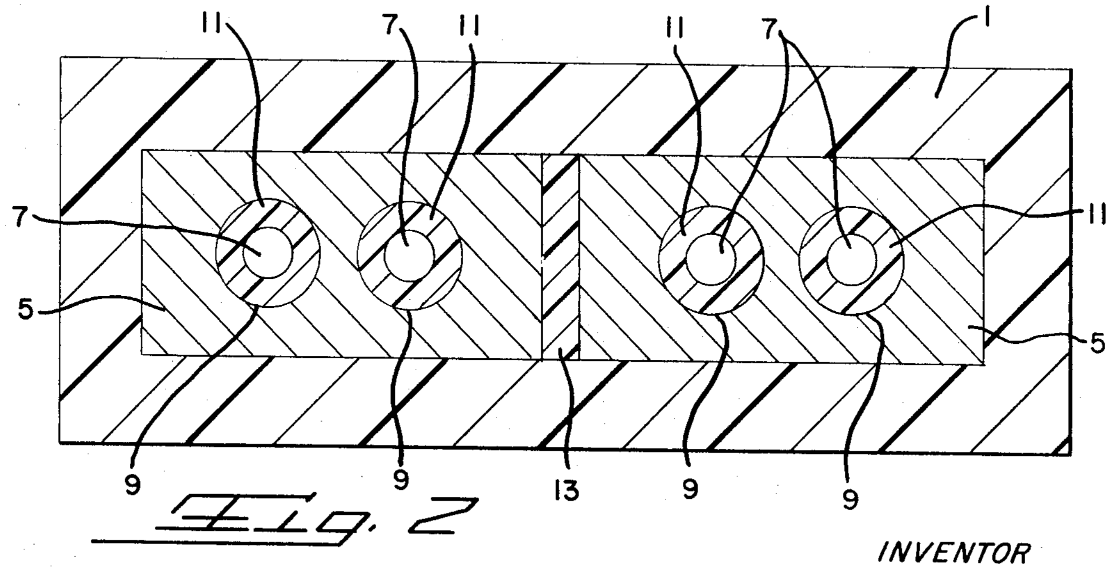
FIG. 2 is a section taken along the line 2–2 of FIG. 1.
Figure 3:
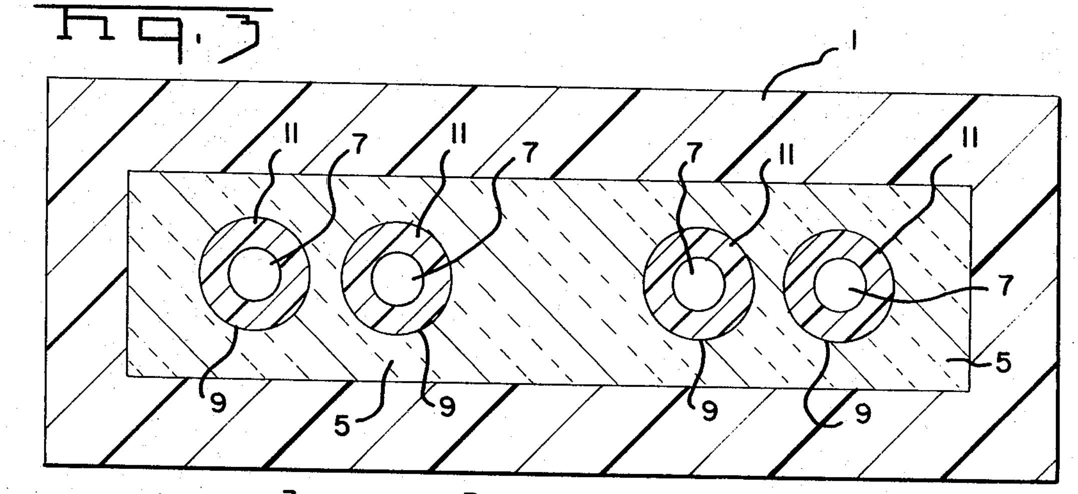
FIG. 3 is a cross-sectional view of the second embodiment of the invention.
Figure 4:
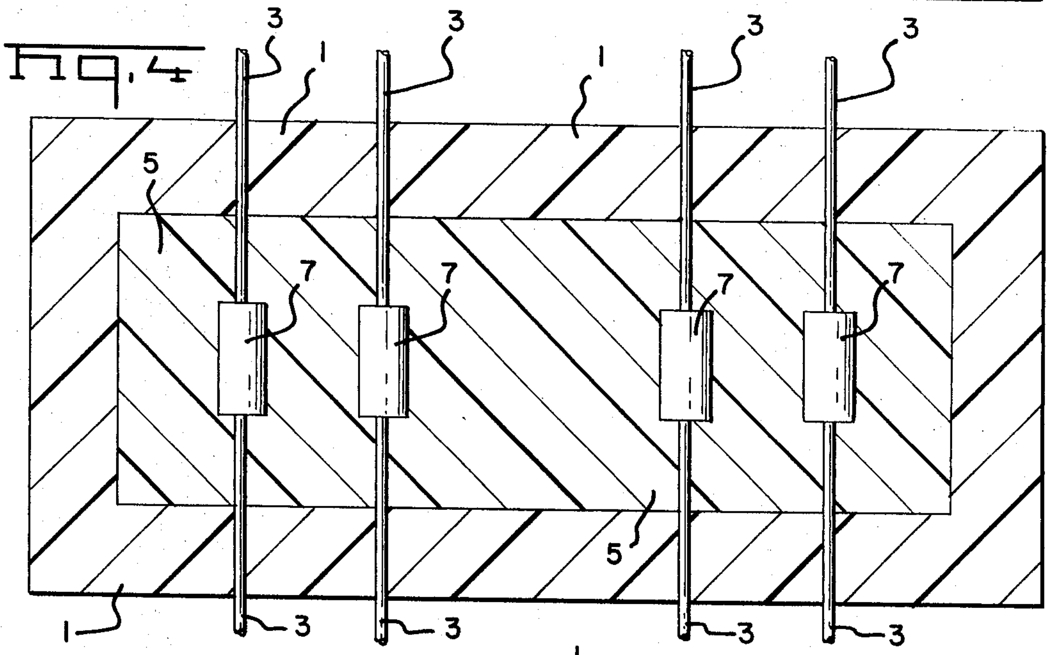
FIG. 4 is a cross-sectional of a third embodiment of the invention similar to FIG. 1.
Figure 5:
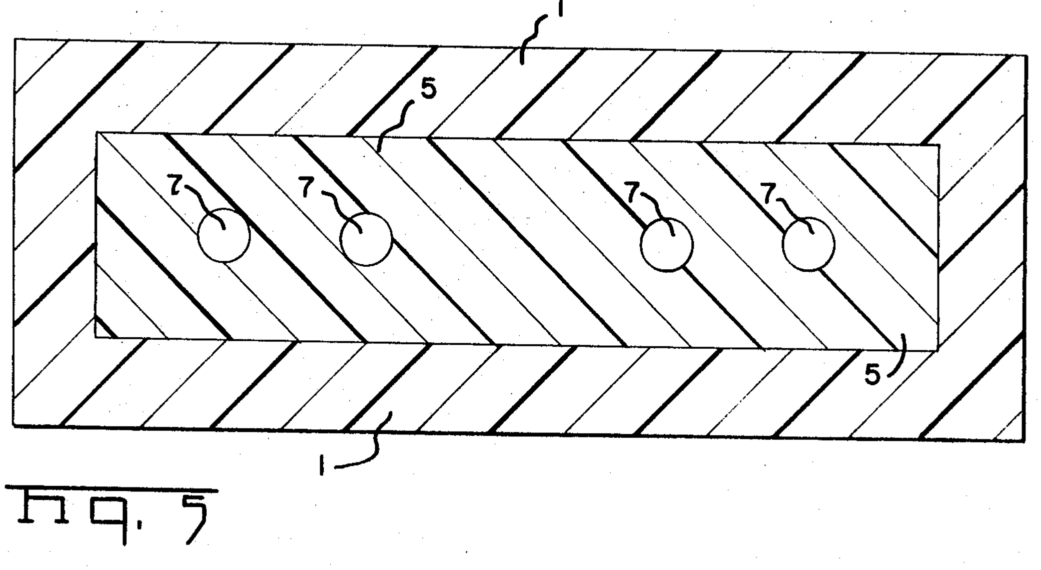
FIG. 5 is a section taken along FIG. 4, the same as in FIG. 2.

According to a second embodiment of the invention, the structure would be substantially identical to that shown in FIGS. 1 and 2 except that the capsule 5 would be formed from a ceramic material such as, for example, aluminum oxide or beryllium oxide. Apertures would be formed in the ceramic as indicated above for the first embodiment. Again, the beryllium oxide epoxy potting compound will be used as previously described. It will be noted that the ceramic used will again have to have high thermal conductivity properties and low electrical conductivity properties.

Referring now to the third embodiment of the invention the system would again be substantially as shown in FIGS. 1 and 2. However, the potting compound and apertures would not be located separate from the rest of the capsule 5. In this embodiment, the electrical components would be suspended within a mold and a beryllium oxide epoxy would be fed into the mold in the form of a powder, thereby completely potting and encapsulating the electrical components. Upon heating of the epoxy to the melting point and then cooling, a block 5 will be formed as shown for the first and second embodiments with the electrical components completely embedded within the beryllium oxide epoxy block. The beryllium oxide epoxy has high thermal conductivity and low electrical conductivity. Again, the outer shell 1 would then be used as in the first two embodiments. It, of course, will be apparent to those skilled in the art that the molding process for forming the third embodiment would require that mold release agents and other known molding techniques would be used.

By providing temperature regulating systems as described above, it is apparent that any heat that passes into the capsule 5 either through the leads 3 or by heat generated by the components 7 themselves will immediately be uniformly distributed through the capsule due to the high thermal conductivity thereof. Accordingly, the hot spots at a particular component due to heating will not readily develop and the temperature of all components will remain substantially the same.

Due to the use of low thermal conductivity shell 1, heat will enter the interior substantially only through the lead 3. This will prevent sudden changes in temperature at the interior of the system within the capsule 5 due to changes in the external environment. The thermal conductivity ratio between the shell 1 and the capsule 5 is about 1000 to 1. In this manner, temperature control of an electrical component of a system is very closely regulated in comparison with prior art regulation systems.

It should be understood that the terms "beryllium oxide epoxy" and "aluminum oxide epoxy" as used in this disclosure, refer to a mixture of an epoxy and beryllium oxide or aluminum oxide, there being sufficient epoxy in the mixture to provide good setting and adhesive properties and sufficient oxide to provide high thermal conductivity.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

What I claim is:

1. A uniform temperature maintaining device retaining electrical components having outwardly extending leads, which comprises a solid high thermal conductivity inner capsule, a relatively low thermal conductivity outer shell completely encapsulating said capsule, said capsule including first apertures therein receiving said components having leads and said outer shell including second apertures through which pass the leads of said components, and a high thermal conductivity, low electrical conductivity material securing said components within said first apertures.

2. A device according to the claim 1 wherein said material is taken from the class consisting of a beryllium oxide epoxy and an aluminum oxide epoxy.

3. A device according to claim 1 wherein said components are completely encapulated in said material and said capsule is formed of an electrically conductive material.

4. A device according to claim 2 wherein said components are completely encapulated in said material and said capsule is formed of an electrically conductive material.

5. A device as set forth in claim 1 further including a mica separator positioned in said capsule and electrically isolating areas thereof.

6. A device as set forth in claim 2 further including a mica separator positioned in said capsule and electrically isolating areas thereof.

7. A device as set forth in claim 1 wherein the ratio of thermal conductivity between said outer shell and said capsule is about 1 to 1000.

8. A device as set forth in claim 2 wherein the ratio of thermal conductivity between said outer shell and said capsule is about 1 to 1000.

9. A device as set forth in claim 3 wherein the ratio of thermal conductivity between said outer shell and said capsule is about 1 to 1000.

10. A uniform temperature maintaining device which comprises a high thermal conductivity beryllium oxide epoxy inner capsule having electrical components embedded therein and a relatively low thermal conductivity outer shell encapsulating said capsule.

11. A device as set forth in claim 10 wherein the ratio of thermal conductivity between said outer shell and said capsule is about 1 to 1000.

12. A uniform temperature maintaining device which comprises a solid high thermal conductivity inner capsule, at least one electrical component having outwardly extending leads embedded therein and a low thermal conductivity shell encapsulating said capsule and initimate therewith at all outer surfaces of said capsule, wherein said capsule is formed from a high thermal conductivity beryllium oxide epoxy.